US009779982B2

(12) United States Patent
Batude et al.

(10) Patent No.: US 9,779,982 B2
(45) Date of Patent: Oct. 3, 2017

(54) FABRICATION METHOD OF A STACK OF ELECTRONIC DEVICES

(71) Applicant: COMMISSARIAT À L'ENERGIE ATOMIQUE ET AUX ENERGIES ALTERNATIVES, Paris (FR)

(72) Inventors: Perrine Batude, Dijon (FR); Laurent Brunet, Grenoble (FR); Claire Fenouillet-Beranger, Voiron (FR); Frank Fournel, Villard-Bonnot (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/388,728

(22) Filed: Dec. 22, 2016

(65) Prior Publication Data

US 2017/0178950 A1    Jun. 22, 2017

(30) Foreign Application Priority Data

Dec. 22, 2015    (FR) ...................................... 15 63132

(51) Int. Cl.
*H01L 21/76*    (2006.01)
*H01L 21/02*    (2006.01)
*H01L 21/762*    (2006.01)

(52) U.S. Cl.
CPC .. *H01L 21/76251* (2013.01); *H01L 21/02532* (2013.01); *H01L 21/02592* (2013.01); *H01L 21/02667* (2013.01)

(58) Field of Classification Search
CPC ......... H01L 21/02; H01L 21/20; H01L 21/30; H01L 21/46; H01L 21/84; H01L 21/76;
(Continued)

(56) References Cited

U.S. PATENT DOCUMENTS

2005/0082526 A1    4/2005   Bedell et al.
2005/0196937 A1*   9/2005   Daval ............... H01L 21/76254
                                                          438/455
(Continued)

FOREIGN PATENT DOCUMENTS

EP    2 005 466 A1    12/2008
EP    2 551 897 A1     1/2013
(Continued)

OTHER PUBLICATIONS

P. Batude et al., "Symposium on VLSI Technology Advance Program", IEEE, The Japan Society of Applied Physics, 2015.
(Continued)

*Primary Examiner* — Chuong A Luu

(57) ABSTRACT

This method includes the following steps: a) providing a first structure successively including a substrate, an electronic device, a dielectric layer, and a first semiconductor layer; b) providing a second structure successively including a substrate, an active layer, a dielectric layer, and a second semiconductor layer, the active layer being designed to form an electronic device; c) bonding the first and second structures by direct bonding between the first and second semiconductor layers so as to form a bonding interface; d) removing the substrate of the second structure so as to expose the active layer; e) introducing dopants into the first and second semiconductor layers so as to form a ground plane.

14 Claims, 4 Drawing Sheets

(58) Field of Classification Search
CPC ......... H01L 21/02532; H01L 21/02592; H01L 21/02667; H01L 21/76251; H01L 21/425
USPC .......................................................... 438/458
See application file for complete search history.

(56) References Cited

U.S. PATENT DOCUMENTS

| | | | |
|---|---|---|---|
| 2006/0057820 A1* | 3/2006 | Yamanaka | H01L 27/14618 438/458 |
| 2009/0020815 A1* | 1/2009 | Godo | H01L 21/84 257/344 |
| 2009/0294813 A1* | 12/2009 | Gambino | H01L 27/14632 257/292 |
| 2011/0171792 A1* | 7/2011 | Chang | G03F 9/7084 438/157 |
| 2011/0201177 A1 | 8/2011 | Fournel et al. | |
| 2011/0284870 A1 | 11/2011 | Le Tiec et al. | |
| 2013/0341649 A1 | 12/2013 | Le Tiec et al. | |
| 2015/0102471 A1 | 4/2015 | Colinge | |

FOREIGN PATENT DOCUMENTS

| | | |
|---|---|---|
| WO | 2007-104767 A1 | 9/2007 |
| WO | 2010-018204 A1 | 2/2010 |
| WO | 2010-049657 A1 | 5/2010 |

OTHER PUBLICATIONS

B.C. Johnson et al., "Dopant-enhanced solid-phase epitaxy in buried amorphous silicon layers", Physical Review B, The American Physical Society, 76, pp. 045216-1-045216-12, 2007.

T.E. Haynes et al., "Composition dependence of solid-phase epitaxy in silicon-germanium alloys: Experiment and theory", Physical Review B, The American Physical Society, vol. 51, No. 12, pp. 7762-7772, 1995.

* cited by examiner

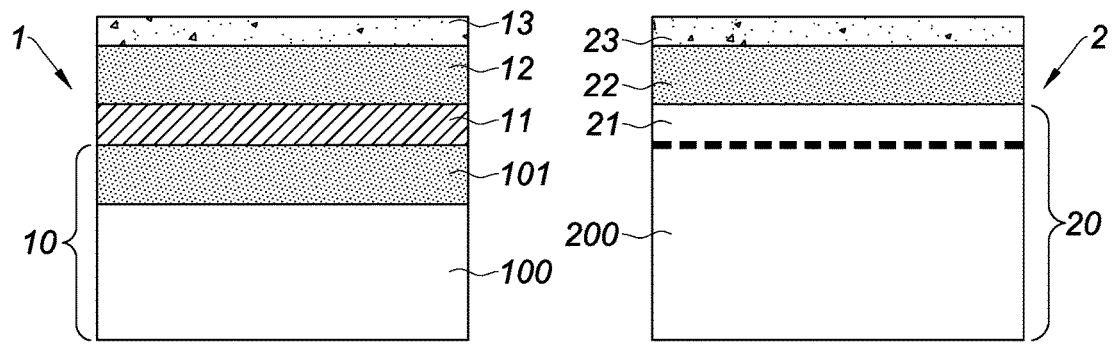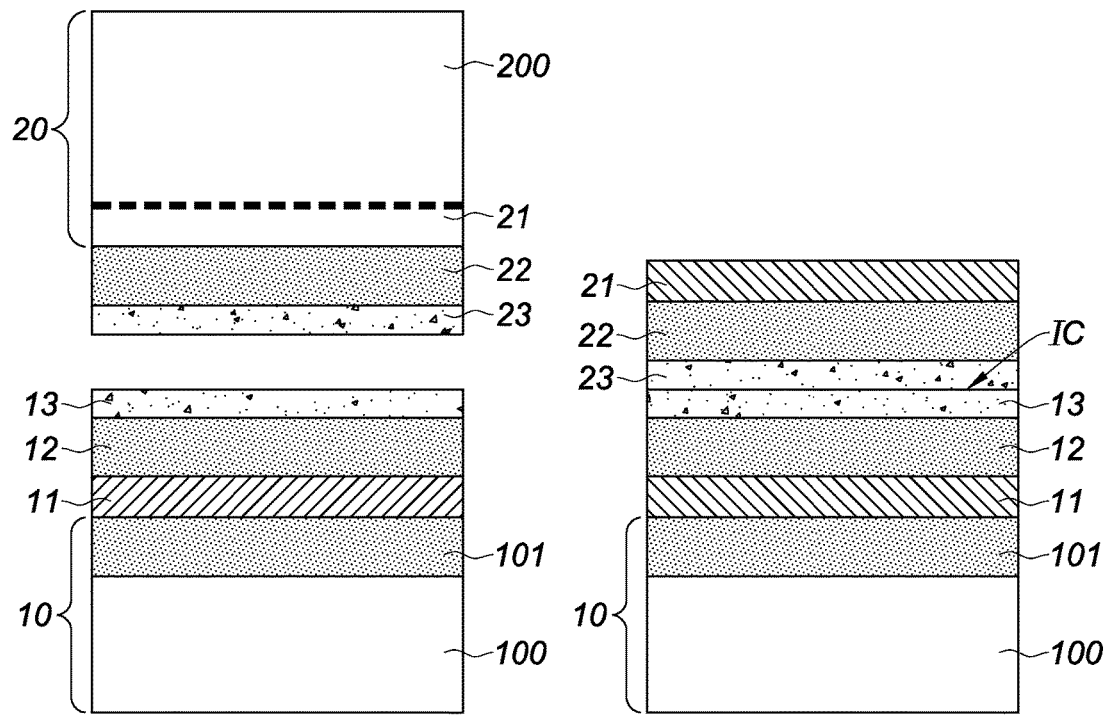
Fig. 2a  Fig. 2b
Fig. 2c  Fig. 2d

FABRICATION METHOD OF A STACK OF ELECTRONIC DEVICES

BACKGROUND OF THE INVENTION

The present invention relates to a fabrication method of a stack of electronic devices. As non-restrictive examples, an electronic device can be a transistor, a memory, a micro electromechanical system (MEMS) etc. An envisaged application is 3D Very-Large-Scale Integration (VLSI) by means of the CoolCube™ technology in order to successively fabricate transistors, the top transistors being fabricated at low temperature (typically less than 500° C.).

STATE OF THE ART

A known method of the state of the art comprises the following steps:
a) providing a first structure successively comprising a substrate, an electronic device, and a first dielectric layer;
b) providing a second structure successively comprising a substrate, an active layer, and a second dielectric layer, the active layer being designed to form an electronic device;
c) bonding the first and second structures by direct bonding between the first and second dielectric layers so as to form a bonding interface;
d) removing the substrate of the second structure so as to expose the active layer.

What is meant by "direct bonding" is bonding resulting from placing two surfaces in direct contact, i.e. in the absence of an additional element such as a glue, a wax or a brazing. The bonding is mainly caused by the Van der Waals forces originating from the electronic interaction between the atoms or molecules of two surfaces. Bonding by molecular adhesion can also be referred to. Conventionally, the first and second dielectric layers are oxides. Such a state-of-the-art method further comprises at least wet chemistry etching, which may be performed in step d), and more generally at a subsequent stage when the electronic device is formed from the active layer.

Such a state-of-the-art method is not entirely satisfactory in so far as the closing of the oxide/oxide bonding interface, obtained after the hydrophilic bonding of step c), is generally of poor quality. Such a partially open bonding interface is therefore liable to lead to extensive infiltration of the etching agents into the first dielectric layer possibly during step d), or more generally at a subsequent stage when the electronic device is formed from the active layer. This infiltration then causes lift-off of the active layer, thereby resulting in a loss of active surface. Lift-off of the active layer is furthermore liable to lead to a considerable defectivity when formation of the electronic device takes place.

A known solution of the state of the art is to apply a reinforcement thermal annealing of the bonding interface with a high thermal budget. What is meant by "thermal budget" is the choice of an annealing temperature value and the choice of an anneal time value. What is meant by "high" is an annealing temperature of about 1000-1200° C. and an anneal time of a few hours. Such a thermal budget is incompatible with most electronic devices which are liable to be impaired. As a non-restrictive example, when the electronic device of the first structure is a planar transistor of Fully-Depleted Silicon on Insulator (FDSOI) type as described in the document by P. Batude et al, Symposium on VLSI Technology Advance Program, in Kyoto, Jun. 16-18, 2015, the maximum admissible thermal budget is about 500° C. for 5 h, 600° C. for 1 min, and 800° C. for 1 ms.

SUMMARY OF THE INVENTION

Accordingly, the object of the present invention is to totally or partially remedy the above-mentioned shortcomings, and relates for this purpose to a fabrication method of a stack of electronic devices, comprising the following steps:
a) providing a first structure successively comprising a substrate, an electronic device, a dielectric layer, and a first semiconductor layer;
b) providing a second structure successively comprising a substrate, an active layer, a dielectric layer, and a second semiconductor layer, the active layer being designed to form an electronic device;
c) bonding the first and second structures by direct bonding between the first and second semiconductor layers so as to form a bonding interface;
d) removing the substrate of the second structure so as to expose the active layer;
e) introducing dopants into the first and second semiconductor layers so as to form a ground plane.

Such a method according to the invention thus makes it possible:
to obtain a bonding interface with a good closing quality (resistant in particular to wet chemistry etching processes) due to the hydrophobic bonding of step c) by means of the first and second semiconductor layers, thereby circumventing the need for reinforcement thermal annealing of the bonding interface with a high thermal budget, i.e. an annealing temperature of about 1000-1200° C. and an anneal time of a few hours;
to form the bonding interface within the ground plane, the ground plane being formed by the doped first and second semiconductor layers and extending on each side of the bonding interface.

Advantageously, the first and/or second semiconductor layers comprise an amorphous film before step c), and the method comprises a crystallization step of the amorphous film or films so that a crystallization front is propagated at the bonding interface.

What is meant by amorphous is that the film presents a mass degree of crystallinity of less than 20%.

Such a crystallization step thus enables closing of the bonding interface to be improved due to the propagation of the crystallization front at the bonding interface. Closing of the bonding interface will be of better quality if both the first and second semiconductor layers comprise an amorphous film so that the crystallization front propagates through the bonding interface; in other words, the crystallization front extends beyond the bonding interface.

According to one embodiment, the amorphous films of the first and second semiconductor layers present different thicknesses so that the crystallization front propagates through the bonding interface.

In other words, the thicknesses of the amorphous films of the first and second semiconductor layers are advantageously chosen such that the crystallization front originating from the less thick amorphous film propagates through the bonding interface and stops at a distance of at least 3 nm from the bonding interface.

Advantageously, the first and second semiconductor layers present different crystallization rates so that the crystallization front propagates through the bonding interface.

In other words, the materials of the first and second semiconductor layers are advantageously chosen such that the crystallization front originating from the material presenting the higher crystallization rate propagates through the bonding interface and stops at a distance of at least 3 nm from the bonding interface.

Advantageously, the first semiconductor layer comprises a polycrystalline seed covered by an amorphous film before step c), and the second semiconductor layer is totally amorphous before step c).

What is meant by "polycrystalline" is that the seed presents a mass degree of crystallinity comprised between 20% and 80%.

What is meant by "totally amorphous" is that the corresponding layer presents a mass degree of crystallinity of less than 20%. Preserving a polycrystalline seed thereby enables:
both the crystallization thermal budget to be reduced,
and a main crystallization direction (vertical) to be imposed so as to prevent random crystallization.

Advantageously, the crystallization step is performed by a suitable thermal annealing to simultaneously thermally activate the dopants introduced in step e).

A single thermal annealing thus suffices for crystallization and thermal activation of the dopants, which enables the time required to perform the method to be reduced. This is particularly advantageous when the first semiconductor layer comprises a polycrystalline seed covered by an amorphous film before step c), and when the second semiconductor layer is totally amorphous before step c).

According to one embodiment, the first and/or second semiconductor layers comprise a surface covered by an oxide film before step c), and the method comprises a surface treatment step consisting in removing the oxide film from the surface of the first and/or second semiconductor layers before step c) so as to obtain hydrophobic bonding in step c).

Such a step thus makes it possible to avoid the presence of an oxide on the first and second semiconductor layers before step c) so as to ensure hydrophobic bonding in step c). Furthermore, it is advantageous not to have any oxide in order to allow propagation of a crystallization front through the bonding interface. The presence of oxide on the first and second semiconductor layers originates from a natural formation such as passivation of silicon.

Advantageously, the method comprises a surface activation step consisting in bombarding the surface of the first and second semiconductor layers before step c) by a beam of species, preferably argon ions.

Such a step thus enables closing of the bonding interface to be improved.

Advantageously, the method comprises a planarization step of the first and second semiconductor layers before step c) so as to obtain a surface roughness of less than 2.5 Å RMS.

Such a step thus enables good-quality direct bonding to be obtained between the first and second semiconductor layers.

Quantification of the surface roughness is to be understood relatively to a quadratic mean surface roughness and is defined in the Standard ISO 25178 (noted Sq in said standard, also called Root Mean Square (RMS)). The surface roughness is measured by a technique described in said standard, for example by means of Atomic Force Microscope (AFM) scanning on a reference surface of $1*1$ µm$^2$.

Advantageously, the first and second semiconductor layers are made from a material selected from the group comprising Si, Ge, and Si—Ge.

According to one form of execution, step e) is executed by introducing the dopants through the exposed active layer.

BRIEF DESCRIPTION OF THE DRAWINGS

Other features and advantages will become apparent from the following description of different embodiments of the invention, given for non-restrictive example purposes only, with reference to the appended drawings in which:

FIGS. 2a to 2d are schematic cross-sectional views illustrating a second embodiment of the invention;

DETAILED DESCRIPTION OF THE EMBODIMENTS

Figure 1A:
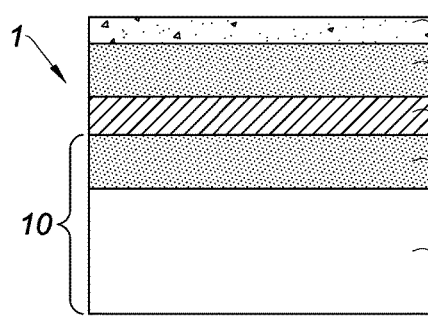
FIGS. 1a to 1d are schematic cross-sectional views illustrating a first embodiment of the invention.
Figure 1B:
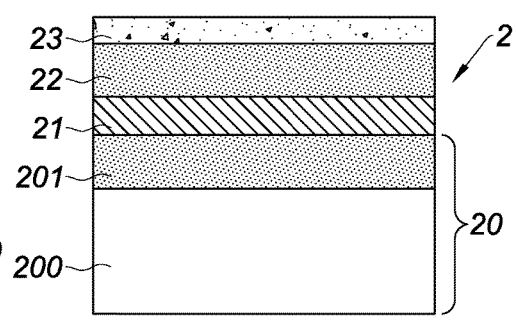
Figure 1C:
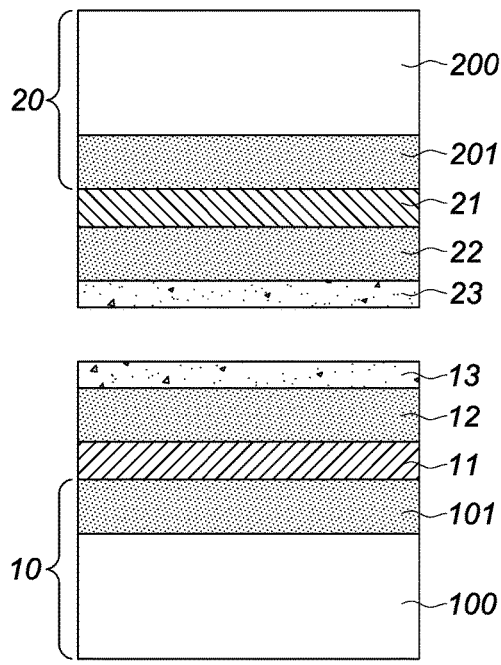
Figure 1D:
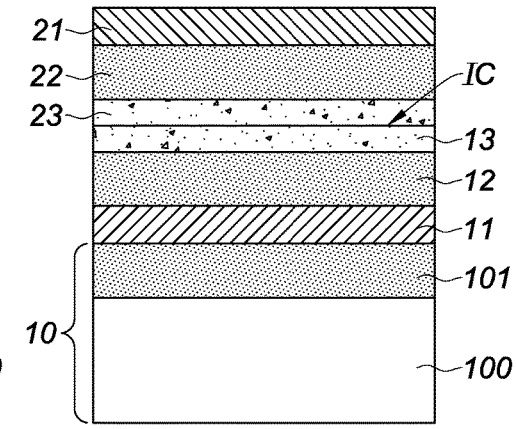

For the different embodiments, the same reference numerals will be used for parts that are identical or which perform the same function, for the sake of simplification of the description. The technical characteristics described in the following for different embodiments are to be considered either alone or in any technically possible combination.

The method illustrated in FIGS. 1a to 1d, 2a to 2d, and 3a to 3e is a fabrication method of a stack of electronic devices 11, 21, comprising the following steps:
a) providing a first structure 1 successively comprising a substrate 10, an electronic device 11, a dielectric layer 12, and a first semiconductor layer 13;
b) providing a second structure 2 successively comprising a substrate 20, an active layer 21, a dielectric layer 22, and a second semiconductor layer 23, the active layer 21 being designed to form an electronic device;
c) bonding the first and second structures 1, 2 by direct bonding between the first and second semiconductor layers 13, 23 so as to form a bonding interface IC;
d) removing the substrate 20 of the second structure 2 so as to expose the active layer 21;
e) introducing dopants into the first and second semiconductor layers 13, 23 so as to form a ground plane GP.

First Structure

The substrate 10 of the first structure 1 advantageously comprises a support substrate 100 on which a dielectric layer 101 is formed. As a non-restrictive example, the support substrate 100 is silicon-based and the dielectric layers 101, 12 are silicon dioxide-based. The dielectric layer 12 forms an intermediate layer between the two electronic devices 11, 21. The dielectric layer 12 preferentially presents a thickness greater than or equal to 85 nm.

Figure 4:
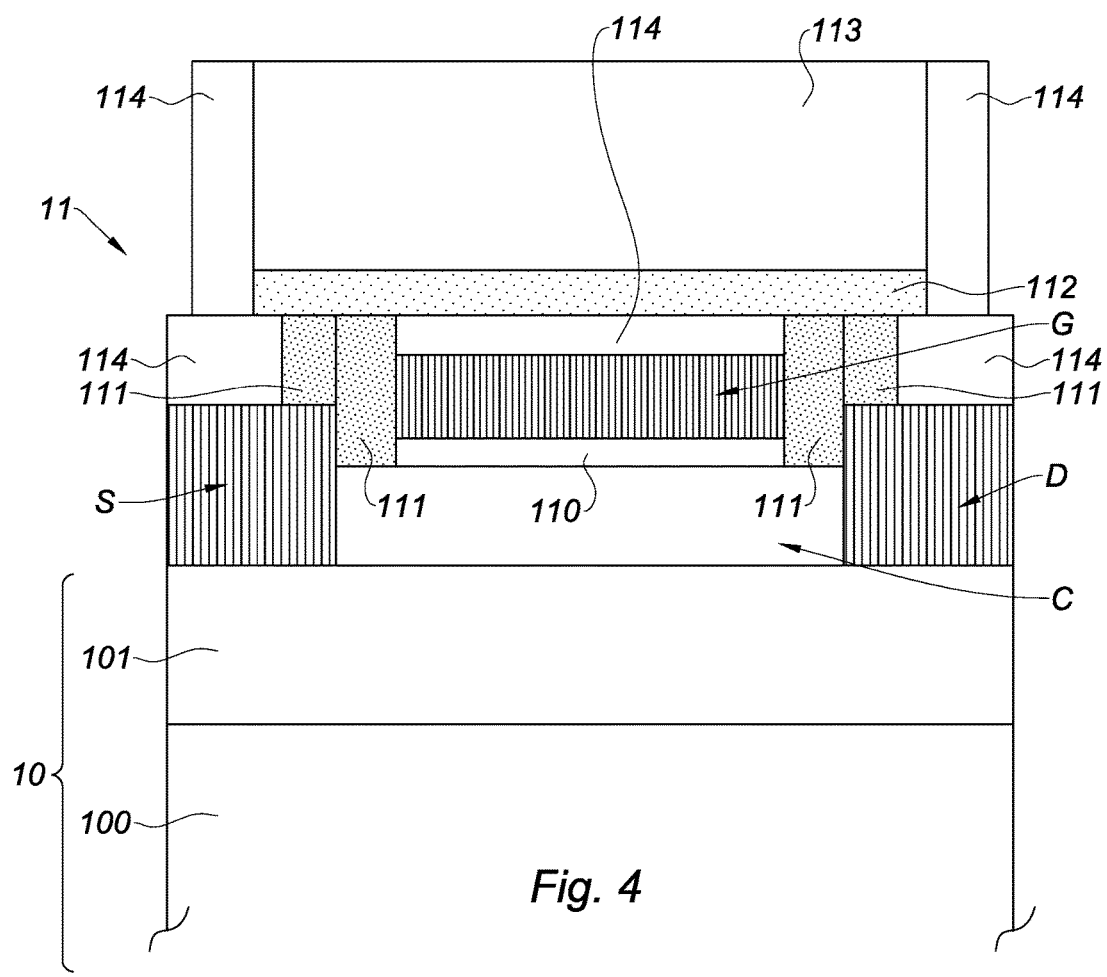
FIG. 4 is a schematic cross-sectional view illustrating an electronic device of transistor type able to belong to a lower level for VLSI.

As a non-restrictive example, the electronic device 11 of the first structure 1 illustrated in FIG. 4 is a MOSFET (standing for Metal Oxide Semiconductor Field Effect Transistor). The electronic device 11 of the first structure 1 comprises:
a source S, a drain D, and a gate G forming the electrodes of the transistor,
contacts 114 extending from said electrodes,
a channel C,
a gate oxide layer 110 separating the channel C from the gate G, spacers 111 made from dielectric material (for example SiN), arranged on each side of the gate G to separate gate G from source S and drain D, in order to prevent short-circuiting, a nitride layer 112 and an oxide layer 113 extending above gate G and spacers 111 so as to prevent short-circuiting of the contacts 114.

The electronic device 11 of the first structure 1 advantageously comprises interconnection levels (not illustrated) between the oxide layer 113 and dielectric layer 12.

Second Structure

The substrate 20 of the second structure 2 advantageously comprises a support substrate 200 on which a dielectric layer 201 is formed. For non-restrictive example purposes, the support substrate 200 is silicon-based and the dielectric layer 201 is silicon dioxide-based. Dielectric layer 201 advantageously forms an etch stop layer in step d). Step d) preferentially comprises a grinding step of the support substrate 200 followed by an etching step of the remaining part of support substrate 200, for example with tetramethylammonium hydroxide (TMAH). Finally, the dielectric layer 201 is etched, preferentially by a wet chemistry etching process.

The substrate 20 can be a substrate of SOI (Silicon-on-Insulator) type on which the dielectric layer 22 is formed by thermal oxidation or deposition.

According to a variant illustrated in FIG. 2b, the substrate 20 comprises a weakened area (illustrated in broken lines) delineating a first part and a second part of the substrate 20. The first part of the substrate 20 forms a support substrate 200. The second part of the substrate 20 is designed to form the active layer 21. The weakened area is preferentially obtained by implantation of species, for example hydrogen. The implantation parameters, essentially the dose and energy, are determined according to the nature of the species and of the substrate 20. Then step d) is executed fracturing the substrate 20 along the weakened area so as to expose the active layer 21.

The dielectric layer 22 of the second structure 2 forms an intermediate layer between the two electronic devices 11, 21. The dielectric layer 22 of the second structure 2 advantageously presents a thickness comprised between 10 nm and 30 nm. The active layer 21 advantageously presents a thickness comprised between 5 nm and 40 nm. As a non-restrictive example, the active layer 21 is silicon-based and the dielectric layer 22 is silicon dioxide-based.

First and Second Semiconductor Layers

The first and second semiconductor layers 13, 23 are advantageously made from a material selected from the group comprising Si, Ge, and Si—Ge. The first and second semiconductor layers 13, 23 are advantageously deposited respectively on dielectric layer 12 and dielectric layer 22 of the first and second structures 1, 2 by Physical Vapor Deposition (PVD) or Chemical Vapor Deposition (CVD). The first and second semiconductor layers each preferentially present a thickness comprised between 5 nm and 30 nm.

According to the embodiments illustrated in FIGS. 1a to 1d, and 2a to 2d, the first and second semiconductor layers 13, 23 are totally polycrystalline before step c). What is meant by "totally polycrystalline" is that the corresponding layer presents a mass degree of crystallinity comprised between 20% and 80%.

Figure 3A:
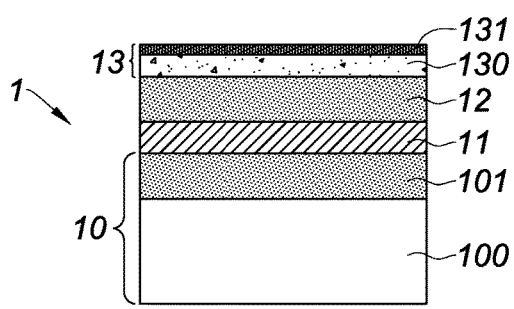
FIGS. 3a to 3e are schematic cross-sectional views illustrating a third embodiment of the invention.
Figure 3B:
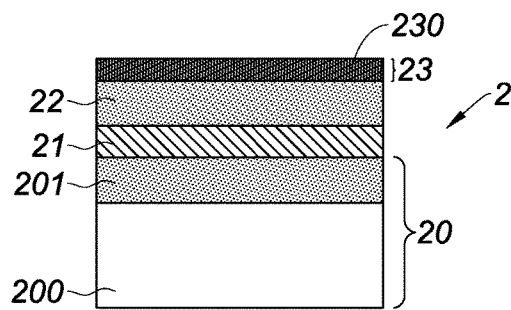
Figure 3C:
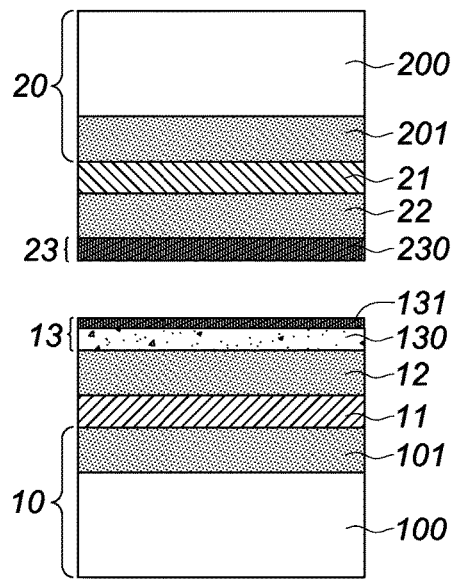
Figure 3D:
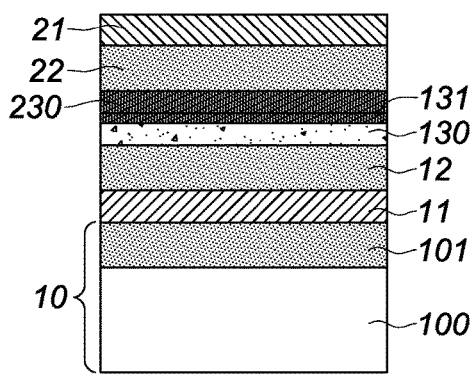
Figure 3E:
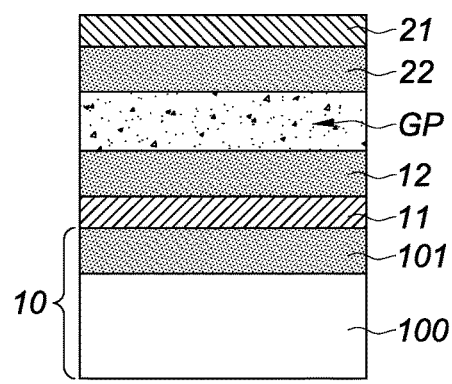

According to the embodiment illustrated in FIGS. 3a to 3e, the first and second semiconductor layers 13, 23 each comprise an amorphous film 131, 230 before step c). More precisely, as illustrated in FIG. 3a, the first semiconductor layer 13 comprises a polycrystalline film 130 covered by an amorphous film 131. The amorphous film 131 is obtained by implantation of species, for example silicon atoms, with a dose of about $10^{13}$ cm$^{-2}$ and an energy of about 10 to 15 keV. The polycrystalline film 130 forms a polycrystalline seed preferentially presenting a thickness comprised between 2 nm and 8 nm. The second semiconductor layer 23, 230 is totally amorphous.

The second semiconductor layer 23 can be deposited in polycrystalline form and then amorphized, or deposited directly in amorphous form.

Surface Treatments

When the first and/or second semiconductor layers 13, 23 comprise a surface covered with an oxide film before step c), the method advantageously comprises a surface treatment step consisting in removing the oxide film from the surface of the first and/or second semiconductor layers 13, 23 before step c) so as to obtain hydrophobic bonding in step c). The surface treatment step is preferably executed with a hydrofluoric acid solution (HF). The hydrofluoric acid solution presents a HF concentration comprised between 1% and 50%, preferentially comprised between 10% and 20%. The HF concentration of the solution is advantageously less than 20% in order to prevent handling risks of the solution for an operator. The HF concentration of the solution is advantageously more than 10% in order to allow a tolerance on the precision of the chemical etching time, thereby avoiding excessive and fast overetching of the semiconductor layers 13, 23. Overetching of the semiconductor layers 13, 23 is in fact all the greater and faster the lower the HF concentration of the solution. This surface treatment step is advantageously the last step executed before step c) (HF last) in order to prevent formation of an oxide on the first and second semiconductor layers 13, 23.

According to a first variant, the surface treatment step is executed with an ammonium fluoride solution NH$_4$F.

According to a second variant, the surface treatment step is executed with a plasma comprising sulphur hexafluoride SF$_6$.

The method advantageously comprises a surface activation step consisting in bombarding the surface of the first and second semiconductor layers 13, 23 before step c) by a beam of species, preferably argon ions. This step is preferentially executed at ambient temperature (i.e. between 20° C. and 30° C.), in a high vacuum, for example a secondary vacuum (i.e. at a pressure of less than $10^{-2}$ mbar), preferentially an ultra-high vacuum (i.e. at a pressure of less than $10^{-7}$ mbar).

The method advantageously comprises a planarization step of the first and second semiconductor layers 13, 23 before step c) so as to obtain a surface roughness of less than 2.5 Å RMS measured by AFM scanning of 1*1 µm$^2$. The planarization step preferentially comprises a chemical mechanical polishing (CMP) step of the first and second semiconductor layers 13, 23.

Crystallization

The method advantageously comprises a crystallization step of the first and second semiconductor layers 13, 23 after step c) so that a crystallization front propagates at the bonding interface IC. The term "crystallization" also covers recrystallization when a semiconductor layer 13, 23 comprises an amorphized polycrystalline part before step c).

According to one form of execution, the amorphous films 131, 230 of the first and second semiconductor layers 13, 23 present different thicknesses so that the crystallization front propagates through the bonding interface IC. The thicknesses of the amorphous films 131, 230 of the first and second semiconductor layers 13, 23 are advantageously chosen so that the crystallization front originating from the less thick amorphous film 131 propagates through the bonding interface IC and stops at a distance of at least 3 nm from the bonding interface IC.

According to an execution variant, the first and second semiconductor layers 13, 23 present different crystallization rates so that the crystallization front propagates through the bonding interface IC. The materials of the first and second semiconductor layers 13, 23 are advantageously chosen such that the crystallization front originating from the material presenting the higher crystallization rate propagates through the bonding interface IC and stops at a distance of at least 3 nm from the bonding interface IC. For this purpose, when the material of the first and second semiconductor layers 13, 23 is silicon or germanium, it is possible to introduce dopants, for example selected from the group comprising Al, As, P, and B, into the material in order to increase the crystallization rate. The person skilled in the art is able to adjust the experimental parameters (e.g. nature of the dopants, concentration, temperature) in order to obtain the required crystallization rate, as illustrated for example in FIG. 6 of the document by B. C. Johnson et al., "*Dopant-enhanced solid-phase epitaxy in buried amorphous silicon layers*", Physical Review B, 76, 045216 (2007). When the material of the first and second semiconductor layers 13, 23 is Si—Ge, it is possible to increase the germanium content in order to increase the crystallization rate. The person skilled in the art is able to adjust the experimental parameters (e.g. Ge content, temperature) in order to obtain the required crystallization rate, as illustrated for example in FIG. 3 of the document by T. E. Haynes et al., "*Composition dependence of solid-phase epitaxy in silicon-germanium alloys: Experiment and theory*", Physical Review B, 51, n° 12, 7762-7771, (1995).

The crystallization step is executed by thermal annealing. The thermal annealing applied presents a suitable thermal budget so as not to impair the electronic device 11 of the first structure 1. When the material of the first and second semiconductor layers 13, 23 is intrinsic silicon, the thermal annealing is preferably applied at a temperature of more than 475° C. and less than 500° C., for a few minutes. As a non-restrictive example, an amorphous semiconductor layer 13, 23, made from intrinsic silicon and with a thickness of 10 nm, can be crystallized with an annealing temperature of 500° C. for 20 minutes. The crystallization thermal annealing is advantageously adjusted to simultaneously thermally activate the dopants introduced in step e).

Bonding Interface

The method can comprise a reinforcement thermal annealing step of the bonding interface IC before step d), the thermal annealing presenting a suitable thermal budget so as not to impair the electronic device 11 of the first structure 1. The thermal budget is advantageously adjusted so as not to crystallize the first and second semiconductor layers 13, 23. It is in fact advantageous not to crystallize the first and second semiconductor layers 13, 23 by the reinforcement thermal annealing as the thermal activation of the dopants is of better quality when it takes place in concomitant manner with the crystallization thermal annealing. If reinforcement thermal annealing is performed, it is therefore performed at a strictly lower temperature than the crystallization temperature of the first and second semiconductor layers 13, 23. The purpose of the reinforcement thermal annealing is to increase the energy of the bonding interface IC (i.e. the adherence) when the latter is insufficient to remove the substrate 20 of the second structure 2 in step d) without any risk of breaking the bonding interface IC.

Ground Plane

Step e) is advantageously executed by introducing dopants into the first and second semiconductor layers 13, 23 through the exposed active layer 21, i.e. after step d). The ground plane GP extends on each side of the bonding interface IC.

The dopants introduced in step e) preferentially comprise:
p-type dopants such as boron or indium, and
n-type dopants such as phosphorus or arsenic.

The p-type and n-type dopants advantageously present a concentration comprised between 2 and $5 \times 10^{18}$ cm$^{-3}$. Step e) is preferentially performed by ion implantation. For example, for phosphorus, the dose is about $10^{13}$ cm$^{-2}$, and the energy is about 35 keV. For boron, the dose is about $10^{13}$ cm$^{-2}$, and the energy is about 15 keV.

The ground plane GP is formed from the doped first and second semiconductor layers 13, 23.

The method comprises a step f) consisting in thermally activating the dopants introduced in step e). As set out in the foregoing, step f) and the step of crystallization of the first and second semiconductor layers 13, 23 are advantageously concomitant.

Step f) can be executed by a thermal annealing presenting a suitable thermal budget. As a non-restrictive example, it is possible to thermally activate the boron atoms, when their concentration is about $10^{18}$ cm$^{-3}$, with an annealing temperature of 600° C. for an anneal time of one minute.

Step f) can also be executed by means of a pulsed laser. The wavelength of the laser is chosen for its selectivity, i.e. the active layer 21 and dielectric layer 22 have to be transparent at this wavelength, whereas the amorphous films 131, 230 of the first and second semiconductor layers 13, 23 have to be absorbent at this wavelength. As a non-restrictive example, when the active layer 21 is silicon-based, when the dielectric layer 22 is silicon dioxide-based, and when the amorphous films 131, 230 are amorphous silicon-based, a wavelength of the laser comprised between 530 nm and 540 nm is selective. Furthermore, the fluence of the laser (for example about 0.1 to 1 J.cm$^{-2}$) and the pulse time (for example about 20 ns to 200 ns) are adjusted to the thicknesses of the active layer 21 and of the dielectric layer 22 in order to reach and thermally activate the dopants introduced into the first and second semiconductor layers 13, 23, without damaging the electronic device 11 of the first structure 1.

According to a variant, the dopants are introduced into the first and second semiconductor layers 13, 23 in steps a) and b), i.e. before step d). This results in an increase of the crystallization rate when the method comprises a crystallization step of the first and second semiconductor layers 13, 23 after step c).

Interconnections, Stack Levels

Naturally, the first structure 1 can be provided with a set of electronic devices 11 extending over the substrate 10. The electronic devices 11 of the set are advantageously interconnected by metallic lines.

Furthermore, the present invention is not limited to two stack levels of electronic devices 11, 21. It is quite possible to envisage at least a third stack level by reiterating the steps of the method after formation of the second device from the active layer 21.

The invention claimed is:

1. A fabrication method of a stack of electronic devices, comprising the following steps:
   a) providing a first structure successively comprising a first substrate, a first electronic device, a first dielectric layer, and a first semiconductor layer;

b) providing a second structure successively comprising a second substrate, an active layer, a second dielectric layer, and a second semiconductor layer, the active layer being designed to form a second electronic device;

c) bonding the first and second structures by direct bonding between the first and second semiconductor layers so as to form a bonding interface;

d) removing the second substrate of the second structure so as to expose the active layer;

e) introducing dopants into the first and second semiconductor layers so as to form a ground plane.

2. Method according to claim 1, wherein the first and/or second semiconductor layers comprise an amorphous film before step c), and wherein the method comprises a crystallization step of the amorphous film or films so that a crystallization front propagates at the bonding interface.

3. Method according to claim 2, wherein the amorphous films of the first and second semiconductor layers present different thicknesses so that the crystallization front propagates through the bonding interface.

4. Method according to claim 2, wherein the first and second semiconductor layers present different crystallization rates so that the crystallization front propagates through the bonding interface.

5. Method according to claim 3, wherein the first and second semiconductor layers present different crystallization rates so that the crystallization front propagates through the bonding interface (IC).

6. Method according to claim 2, wherein the first semiconductor layer comprises a polycrystalline seed covered by an amorphous film before step c), and in that the second semiconductor layer is totally amorphous before step c).

7. Method according to claim 3, wherein the first semiconductor layer comprises a polycrystalline seed covered by an amorphous film before step c), and in that the second semiconductor layer is totally amorphous before step c).

8. Method according to claim 4, wherein the first semiconductor layer comprises a polycrystalline seed covered by an amorphous film before step c), and in that the second semiconductor layer is totally amorphous before step c).

9. Method according to claims 2, wherein the crystallization step is executed by a suitable thermal annealing to simultaneously thermally activate the dopants introduced in step e).

10. Method according to claim 1, wherein the first and/or second semiconductor layers comprise a surface covered by an oxide film before step c), and wherein the method comprises a surface treatment step consisting in removing the oxide film from the surface of the first and/or second semiconductor layers before step c) so as to obtain hydrophobic bonding in step c).

11. Method according to claim 1, comprising a surface activation step consisting in bombarding the surface of the first and second semiconductor layers before step c) by a beam of species.

12. Method according to claim 1, comprising a planarization step of the first and second semiconductor layers before step c) so as to obtain a surface roughness of less than 2.5 Å RMS.

13. Method according to claim 1, wherein the first and second semiconductor layers are made from a material selected from the group comprising Si, Ge, and Si—Ge.

14. Method according to claim 1, wherein step e) is executed by introducing dopants through the exposed active layer.

* * * * *